United States Patent
Ish-Shalom et al.

(10) Patent No.: US 9,230,639 B2
(45) Date of Patent: Jan. 5, 2016

(54) SNR ESTIMATION IN ANALOG MEMORY CELLS

(71) Applicant: Apple Inc., Cupertino, CA (US)

(72) Inventors: Tomer Ish-Shalom, Raanana (IL); Ronen Dar, Tel Aviv (IL)

(73) Assignee: Apple Inc., Cupertino, CA (US)

(*) Notice: Subject to any disclaimer, the term of this patent is extended or adjusted under 35 U.S.C. 154(b) by 0 days.

(21) Appl. No.: 14/799,945

(22) Filed: Jul. 15, 2015

(65) Prior Publication Data
US 2015/0318037 A1 Nov. 5, 2015

Related U.S. Application Data

(62) Division of application No. 13/657,150, filed on Oct. 22, 2012, now Pat. No. 9,136,001.

(51) Int. Cl.
*G11C 16/10* (2006.01)
*G11C 11/56* (2006.01)
*G11C 16/08* (2006.01)

(52) U.S. Cl.
CPC ............ *G11C 11/5642* (2013.01); *G11C 16/08* (2013.01)

(58) Field of Classification Search
CPC ........... G11C 16/3427; G11C 16/3422; G11C 16/3418; G11C 27/005
USPC .............. 365/185.02, 185.03, 185.09, 185.24
See application file for complete search history.

(56) References Cited

U.S. PATENT DOCUMENTS

| | | | |
|---|---|---|---|
| 7,814,401 B2 | 10/2010 | Alrod | |
| 8,000,135 B1 | 8/2011 | Perlmutter | |
| 8,060,806 B2 | 11/2011 | Shalvi | |
| 8,156,398 B2 | 4/2012 | Sommer | |
| 8,531,888 B2 | 9/2013 | Chilappagari | |
| 9,136,001 B2* | 9/2015 | Ish-Shalom | G11C 16/10 |
| 2006/0028875 A1 | 2/2006 | Avraham | |
| 2010/0091535 A1 | 4/2010 | Sommer | |
| 2011/0066902 A1 | 3/2011 | Sharon et al. | |
| 2011/0161775 A1 | 6/2011 | Weingarten | |
| 2012/0026789 A1 | 2/2012 | Shalvi | |
| 2014/0010009 A1 | 1/2014 | Chilappagari et al. | |
| 2014/0112076 A1 | 4/2014 | Ish-Shalom | |

* cited by examiner

*Primary Examiner* — Andrew Q Tran
(74) *Attorney, Agent, or Firm* — Meyertons, Hood, Kivlin, Kowert & Goetzel, P.C.

(57) ABSTRACT

A method includes programming a group of analog memory cells by writing respective analog values into the memory cells in the group. After programming the group, the analog values are read from the memory cells in the group using a set of read thresholds so as to produce readout results. Respective optimal positions for the read thresholds in the set are identified based on the readout results. A noise level in the readout results is estimated based on the identified optimal positions of the read thresholds.

20 Claims, 2 Drawing Sheets

SNR ESTIMATION IN ANALOG MEMORY CELLS

CROSS-REFERENCE TO RELATED APPLICATIONS

This application is a divisional application of U.S. patent application Ser. No. 13/657,150, entitled "SNR Estimation in Analog Memory Cells", filed Oct. 22, 2012, which is related to U.S. patent application Ser. No. 13/657,061, entitled "Soft readout from analog memory cells in the presence of read threshold errors," filed Oct. 22, 2012, which are hereby incorporated by reference in its entirety as though fully and completely set forth herein.

TECHNICAL FIELD

Embodiments described herein relate generally to memory devices, and particularly to methods and systems for reading memory cells such including analog memory cells.

BACKGROUND

Several types of memory devices, such as Flash memories, use arrays of analog memory cells for storing data. Each analog memory cell holds a certain level of a given physical quantity such as an electrical charge or voltage, which represents the data stored in the cell. The levels of this physical quantity are also referred to as analog storage values, storage values or analog values. In Flash memories, for example, each analog memory cell holds a certain amount of electrical charge. The range of possible analog values is typically divided into regions, each region corresponding to a programming state or programming level that represents one or more data bit values. Data is written to an analog memory cell by writing a nominal analog value that corresponds to the desired bit or bits.

Some memory devices, which are commonly referred to as Single-Level Cell (SLC) devices, store a single bit of information in each memory cell, i.e., each memory cell can be programmed to assume two possible memory states. Higher-density devices, often referred to as Multi-Level Cell (MLC) devices, store two or more bits per memory cell, i.e., can be programmed to assume more than two possible memory states.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate," Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the $24^{th}$ International Conference on Microelectronics (MIEL), Nis, Serbia and Montenegro, May 16-19, 2004, volume 1, pages 377-384, which is incorporated herein by reference.

Analog memory cells are typically read by comparing their storage values to one or more read thresholds. Various methods for setting and adjusting read thresholds are known in the art. For example, U.S. Patent Application Publication 2010/0091535, whose disclosure is incorporated herein by reference, describes a method for operating a memory that includes a plurality of analog memory cells. The method includes storing data in the memory by writing first storage values to the cells. Second storage values are read from the cells, and a Cumulative Distribution Function (CDF) of the second storage values is estimated. The estimated CDF is processed so as to compute one or more thresholds. As another example, U.S. Pat. No. 8,000,135, whose disclosure is incorporated herein by reference, describes techniques for estimation of memory cell read thresholds by sampling inside programming level distribution intervals.

U.S. Patent Application Publication 2011/0066902, whose disclosure is incorporated herein by reference, describes a system and method of reading data using a reliability measure. In some embodiments, a data storage device includes a memory array including a target memory cell and one or more other memory cells. The device also includes a controller coupled to the memory array. The controller is configured to directly compute a reliability measure for at least one bit stored in the target memory cell of the memory array based on a voltage value associated with the target memory cell and based on one or more corresponding voltage values associated with each of the one or more other memory cells of the memory array.

BRIEF SUMMARY

An embodiment that is described herein provides a method including programming a group of memory cells by writing respective values into the memory cells in the group. After programming the group, the values are read from the memory cells in the group using a set of read thresholds so as to produce readout results. Respective optimal positions for the read thresholds in the set are identified based on the readout results. A noise level in the readout results is estimated based on the identified optimal positions of the read thresholds.

In some embodiments, estimating the noise level includes assessing the noise level responsively to a change between first and second estimations of the optimal positions at respective different times. In an embodiment, estimating the noise level includes assessing the noise level responsively to a distance between the optimal positions of first and second read thresholds in the set. Estimating the noise level may include assessing the noise level responsively to a distance between the optimal positions and respective current positions of the read thresholds using which the readout results were obtained.

In some embodiments, the method includes computing reliability measures for the readout results based on the estimated noise level. Computing the reliability measures may include calculating a reliability measure for a readout result relating to a first read threshold in the set, based on the noise level estimated for a second read threshold in the set.

There is additionally provided, in accordance with an embodiment, a method including programming a group of memory cells by writing respective values into the memory cells in the group. After programming the group, the values are read from the memory cells in the group using a set of read thresholds so as to produce readout results. A measure of information entropy of the readout results is calculated, and a noise level in the readout results is estimated based on the calculated measure of the information entropy.

In some embodiments, programming the group includes storing in the memory cells data represented by the analog values, and calculating the measure of the information entropy includes calculating mutual information for the readout results and for decoding results of the data. In another embodiment, calculating the measure of the information entropy includes evaluating an empirical entropy function over the readout results.

There is also provided, in accordance with an embodiment an apparatus including an interface and storage circuitry. The interface is configured to communicate with a memory that includes memory cells. The storage circuitry is configured to program a group of the memory cells by writing respective values into the memory cells in the group, to read the values from the memory cells in the group, after programming the group, using a set of read thresholds so as to produce readout results, to identify, based on the readout results, respective optimal positions for the read thresholds in the set, and to estimate a noise level in the readout results based on the identified optimal positions of the read thresholds.

There is further provided, in accordance with an embodiment, an apparatus including an interface and storage circuitry. The interface is configured to communicate with a memory that includes memory cells. The storage circuitry is configured to program a group of the memory cells by writing respective values into the memory cells in the group, to read the values from the memory cells in the group, after programming the group, using a set of read thresholds so as to produce readout results, to calculate a measure of information entropy of the readout results, and to estimate a noise level in the readout results based on the calculated measure of the information entropy.

There is also provided, in accordance with an embodiment, an apparatus including a memory and storage circuitry. The memory includes memory cells. The storage circuitry is configured to program a group of the memory cells by writing respective values into the memory cells in the group, to read the values from the memory cells in the group, after programming the group, using a set of read thresholds so as to produce readout results, to identify, based on the readout results, respective optimal positions for the read thresholds in the set, and to estimate a noise level in the readout results based on the identified optimal positions of the read thresholds.

There is further provided, in accordance with an embodiment, an apparatus including a memory and storage circuitry. The memory includes memory cells. The storage circuitry is configured to program a group of the memory cells by writing respective values into the memory cells in the group, to read the values from the memory cells in the group, after programming the group, using a set of read thresholds so as to produce readout results, to calculate a measure of information entropy of the readout results, and to estimate a noise level in the readout results based on the calculated measure of the information entropy.

These and other embodiments will be more fully understood from the following detailed description of the embodiments thereof, taken together with the drawings in which:

DETAILED DESCRIPTION OF EMBODIMENTS

Overview

Figure 1:
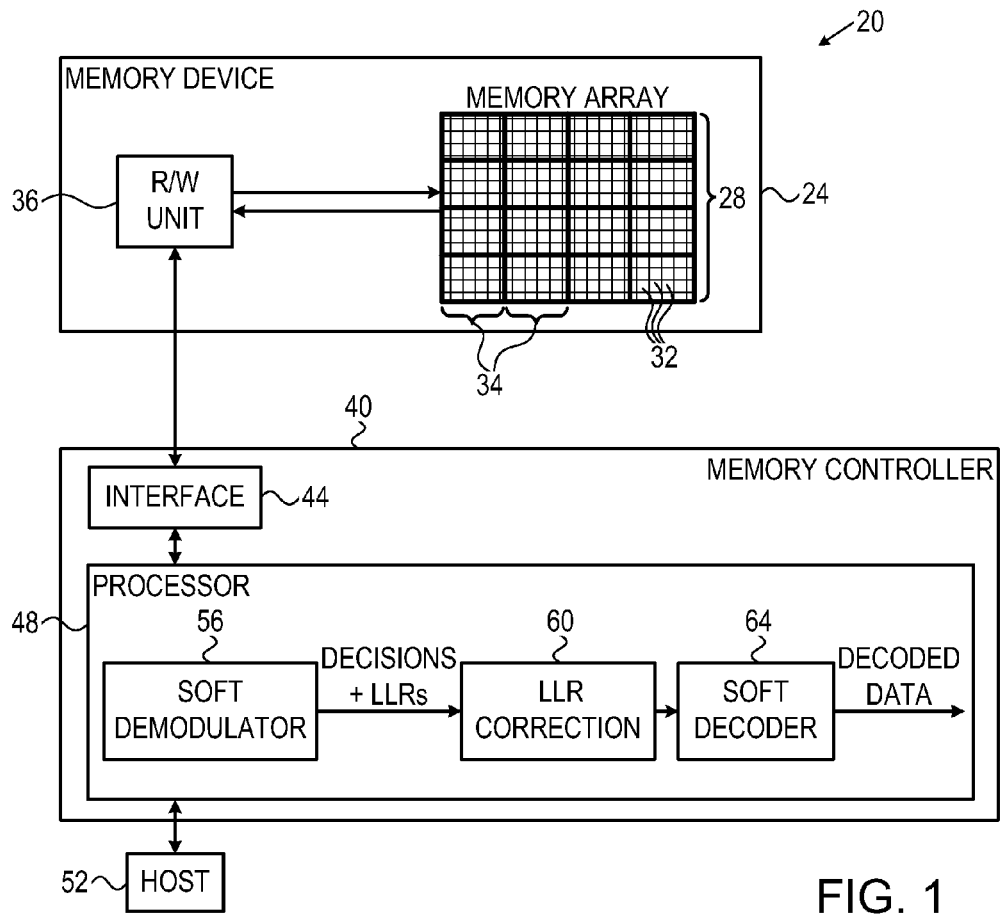
FIG. 1 is a block diagram that schematically illustrates a memory system, in accordance with an embodiment.

Embodiments that are described herein provide improved methods and systems for reading data stored in memory cells, such as analog memory cells that make up Flash cells. In some disclosed embodiments, a memory controller stores data in a group of analog memory cells by writing respective analog values into the cells. In a NAND Flash device, for example, the programming operation sets the memory cells to respective threshold voltages that represent the stored data.

At a later time, the memory controller reads and decodes the stored data in a soft decoding process: The memory controller reads the memory cells in the group two or more times, using two or more respective read thresholds, so as to produce readout results. The memory controller then uses the readout results to compute soft reliability measures for the analog values.

The reliability measures may comprise, for example, Log Likelihood Ratios (LLRs) for the possible bit values that may be stored in the memory cells. The memory controller decodes the stored data based on the reliability measures.

Although the embodiments described below refer mainly to soft readout (i.e., two or more readout operations per cell group, using different read thresholds), the disclosed techniques can also be used with hard readout (i.e., a single readout operation per cell group a single read threshold setting).

In some practical scenarios, however, the read thresholds used for reading the memory cells may be positioned sub-optimally, for various reasons. The sub-optimality can be represented by an offset between the actual read thresholds and the optimal read threshold position. Sub-optimal positioning of read thresholds typically distorts the reliability measures, and thus increases the probability of read errors. Optimality and sub-optimality can be defined, for example, in terms of maximizing Mutual Information (MI) or minimizing Bit Error Rate (BER).

In some embodiments that are described herein, the memory controller estimates the offset of the read thresholds from the optimal position, and modifies the reliability measures so as to compensate for this offset. Typically, the memory controller performs this calculation based on the initial readout results of the sub-optimal read thresholds, without reading the memory cells again.

The memory controller then decodes the stored data using the modified reliability measures. Because of the correction applied to the modified reliability measures, the decoding operation is able to achieve improved error probability performance. The achievable performance may approach the performance that would be achieved by optimal positioning of the read thresholds. Since the correction is performed without re-reading the memory cells, latency and power consumption are reduced.

The memory controller may estimate the offset and modify the reliability measures in various ways. When the reliability measures comprise LLRs, for example, the memory controller may estimate the offset by estimating a deviation of the average LLR from zero. Several examples of LLR computation and offset estimation are described below. Other LLR computation and adaptation methods are also described below.

In some embodiments, the memory controller may calculate the reliability measures by assessing the Signal to Noise Ratio (SNR) of the readout results, and calculating the reliability measures as a function of the SNR. Several example techniques for SNR estimation are described herein. Alternatively, the memory controller may use the SNR estimation techniques described herein for any other suitable purpose.

System Description

FIG. 1 is a block diagram that schematically illustrates a memory system 20, in accordance with an embodiment of the present invention. System 20 can be used in various host systems and devices, such as in computing devices, cellular phones or other communication terminals, removable memory modules (sometimes referred to as "USB Flash Drives"), Solid State Disks (SSD), digital cameras, music and other media players and/or any other system or device in which data is stored and retrieved.

System 20 comprises a memory device 24, which stores data in a memory cell array 28. The memory array comprises multiple memory blocks 34. Each memory block 34 comprises multiple analog memory cells 32. In the context of the present patent application and in the claims, the term "analog memory cell" is used to describe any memory cell that holds a continuous, analog value of a physical parameter, such as an electrical voltage or charge. Array 28 may comprise analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells. Although the embodiments described herein refer mainly to two-dimensional (2D) cell connectivity schemes, the disclosed techniques are applicable to three-dimensional (3D) connectivity schemes, as well.

The charge levels stored in the cells and/or the analog voltages or currents written into and read out of the cells are referred to herein collectively as analog values, analog storage values or storage values. The storage values may comprise, for example, threshold voltages or any other suitable kind of storage values. System 20 stores data in the analog memory cells by programming the cells to assume respective programming states, which are also referred to as programming levels. The programming states are selected from a finite set of possible states, and each programming state corresponds to a certain nominal storage value. For example, a 3 bit/cell MLC can be programmed to assume one of eight possible programming states by writing one of eight possible nominal storage values into the cell.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells into digital samples having a resolution of one or more bits. Data is typically written to and read from the memory cells in groups that are referred to as pages. In some embodiments, the R/W unit can erase a group of cells 32 by applying one or more negative erasure pulses to the cells. Erasure is typically performed in entire memory blocks.

The storage and retrieval of data in and out of memory device 24 is performed by a memory controller 40. The memory controller comprises an interface 44 for communicating with memory device 24, and a processor 48 that carries out the various memory management functions. Memory controller 40 communicates with a host 52, for accepting data for storage in the memory device and for outputting data retrieved from the memory device.

Memory controller 40, and in particular processor 48, may be implemented in hardware. Alternatively, the memory controller may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

Although the example of FIG. 1 shows a single memory device 24, system 20 may comprise multiple memory devices that are controlled by memory controller 40. In the exemplary system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor or other element of the host system. In some embodiments, host 52 and memory controller 40 may be fabricated on the same die, or on separate dies in the same device package.

In some embodiments, memory controller 40 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of array 28, memory cells 32 are arranged in multiple rows and columns, and each memory cell comprises a floating-gate transistor. The gates of the transistors in each row are connected by word lines, and the sources of the transistors in each column are connected by bit lines. The memory array is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages. For example, in some devices each row is divided into two pages, one comprising the odd-order cells and the other comprising the even-order cells.

Typically, memory controller 40 programs data in page units, but erases entire memory blocks 34. Typically although not necessarily, a memory block is on the order of $10^6$ memory cells, whereas a page is on the order of $10^3$-$10^4$ memory cells.

The description that follows describes several example techniques for reading and decoding the data stored in memory cells 32. The disclosed techniques can be carried out by memory controller 40 and/or by R/W unit 36. For the sake of clarity, the description that follows refers to a particular division of functions between R/W unit 36 in the memory device and processor 48 in memory controller 40. Generally, however, the various tasks making-up the disclosed techniques can be divided between the memory controller and the R/W unit in any suitable manner, or performed by any one of these elements. Thus, in the context of the present patent application and in the claims, memory controller 40 and R/W circuitry 36 are referred to jointly as storage circuitry that carries out the disclosed techniques.

Compensation for Read Threshold Errors Using LLR Correction

In the example configuration of FIG. 1, processor 48 of memory controller 40 decodes the data stored in a group of memory cells 32 using a soft decoding process. Typically, processor 48 instructs R/W unit 36 to read the group of memory cells two or more times, using two or more respective read thresholds, so as to produce readout results. In such a readout scheme, the memory controller is provided with two or more readout results for each memory cell in the group, which were read using different respective read thresholds. The memory controller then computes soft reliability measures for the various data bits, and decodes the data using the soft reliability measures.

The description that follows refers mainly to Log Likelihood Ratios (LLRs) that are computed for the respective data bits. The disclosed techniques, however, are not limited to LLRs and can be used with any other suitable type of soft reliability measures. Typically, the reliability measures are signed, i.e., comprise both magnitude and sign information.

Typically, memory controller 40 aims to position the read thresholds at an optimal position on the threshold voltage ($V_{TH}$) axis, which minimizes the probability of read errors. The optimal read threshold position can be defined, for example, as the position that yields the maximum Mutual Information (MI) or minimum Bit Error Rate (BER). The optimal position typically lies in a boundary region between adjacent programming levels (as demonstrated in FIG. 2 below).

In practice, however, the read thresholds may not always be positioned at the optimal position, for various reasons. When the read thresholds are positioned sub-optimally, the resulting LLRs will typically not enable minimal error probability. In some embodiments, processor in memory controller 40 compensates for this sub-optimality by adjusting the LLRs.

In the example configuration of FIG. 1, processor 48 comprises a soft demodulator 56, which receives the multiple readout results obtained using the multiple read thresholds and uses them for soft demodulation. For each memory cell, demodulator 56 produces a hard decision that estimates the data value stored in the cell, and an LLR that quantifies the reliability assigned to the hard decision. Each LLR typically a sign, which is indicative of the hard decision or bit value, and an absolute value indicative of the reliability of that bit value. As explained above, the disclosed techniques can be used with various signed reliability measures.

An LLR correction module 60 modifies the LLRs produced by demodulator 56 so as to compensate for the offset of the read thresholds from their optimal position. Typically, module 60 first estimates the offset, and then corrects the LLRs based on the estimated offset.

In an example embodiment, module 60 estimates the offset based on the LLRs and on the distribution of cell threshold voltages relative to the various read thresholds. This distribution may be represented by a "zone histogram." In an embodiment, the zone histogram corresponding to T read thresholds is defined as a vector of length T+1, such that the first vector element holds the estimated number of memory cells whose voltage level lies below all thresholds, the last element holds the estimated number of cells whose voltage level lies above all thresholds, and for k=2, . . . , T, the $k^{th}$ vector element holds an estimation of the number of cells whose voltage level lies between the $(k-1)^{th}$ smallest threshold and the $k^{th}$ smallest threshold.

Note that the number of cells in each vector element (zone histogram bin) is an estimate, as some cells may respond or fail to respond to a read threshold due to read noise. Furthermore, some cells may react to a low threshold but not to higher thresholds. This phenomenon may be corrected using suitable processing or ignored, since the number of such cells is likely to be small.

A soft decoder 64 then decodes the data stored in the group of memory cells based on the corrected LLRs. Typically, the stored data is encoded with an Error Correction Code (ECC), such as a Low Density Parity Check (LDPC) or Bose-Chaudhuri-Hocquenghem (BCH) code, and decoder 64 decodes the ECC using the LLRs. Effectively, decoder 64 can be viewed as correcting erroneous hard decisions of demodulator 56.

The internal structure of processor 48 shown in FIG. 1 is given purely by way of example. Any other suitable configuration can also be used in alternative embodiments. The various processor modules (e.g., demodulator 56, LLR correction module 60 and decoder 64) may be implemented in software, in hardware, or both.

Figure 2:
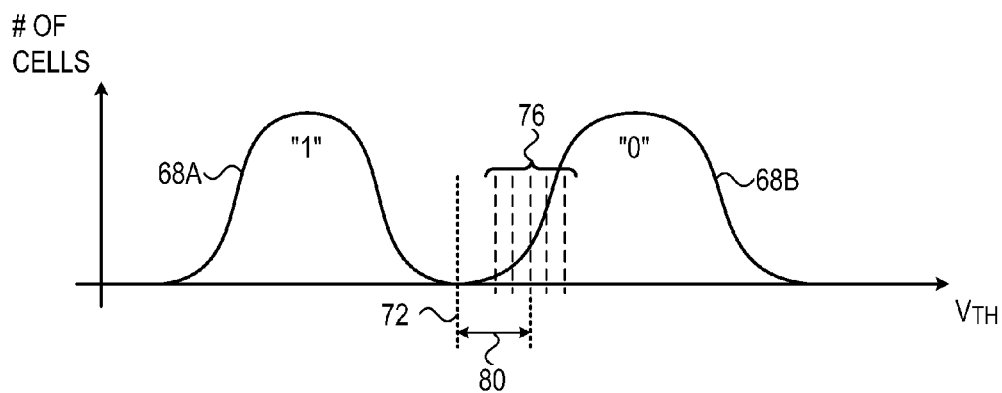
FIG. 2 is a graph showing programming level distributions in a group of analog memory cells, and associated read thresholds, in accordance with an embodiment.

FIG. 2 is a graph showing programming level distributions in a group of analog memory cells 32, and associated read thresholds, in accordance with an embodiment. The group of memory cells typically belongs to a given word line, and used for storing one or more data pages. For the sake of clarity, the present example refers to two programming levels, each storing a single bit. Generally, however, the disclosed techniques can also be used with MLC devices, which use more than two programming levels, each storing more than a single bit.

The figure shows the threshold voltage distributions of two programming levels 68A and 68B, which represent data values "1" and "0", respectively. In order to perform readout from the memory cells in the group, the read thresholds are to be placed in the boundary region between the two programming levels. The optimal read threshold position is marked by a line 72.

In the example scenario of FIG. 2, memory controller 40 reads the group of memory cells using a set of five read thresholds 76. Thus, R/W unit 36 reads each memory cell five times, using the five respective read thresholds. Soft demodulator 56 produces a respective LLR for each memory cell, based on the five readout results of that cell. (In alternative embodiments, any other suitable number of read thresholds can be used, and the read thresholds need not necessarily be distributed at uniform intervals.)

As can be seen in the figure, however, read thresholds 76 are not positioned optimally. An offset 80 exists between optimal position 72 and the actual position of the read thresholds. (In this example the offset is measured from the middle of the interval occupied by the read thresholds, although other conventions can also be used.)

In some embodiments, LLR correction module 60 estimates the size of offset 80, and corrects the LLRs as a function of the estimated offset. The corrected LLRs are provided to soft decoder 64 for decoding.

LLR correction module 60 may estimate offset 80, and modify the LLRs as a function of the offset, in various ways. In an example embodiment, module 60 calculates the mean of the LLRs over the group of memory cells, and compares the mean to zero. Since an LLR is defined as a logarithm of a ratio of probabilities, it may take negative or positive values. When the read thresholds are positioned at the optimal position, the LLR statistics are expected to be symmetrical, and the mean of the LLRs is expected to be near zero. (As explained above, the disclosed techniques can alternatively be used with other sorts of reliability measures having sign and magnitude information.)

A large deviation of the mean from zero is therefore indicative of a sub-optimal position of the read thresholds. Processor 48 may estimate the size of the sub-optimality (e.g., the size of offset 80) as a function of the deviation of the mean LLR from zero. Module 60 may compute a correction for the LLRs by multiplying the mean LLR by a constant, and then subtracting the correction from the LLRs. The constant may depend, for example, on the properties of memory cells 32 or memory device 24 in general. In an example embodiment, the constant does not depend on the read thresholds, but does depend on the threshold voltage distribution.

The description above refers to a scheme that causes the mean of the reliability measure to reach zero. This technique is well suited, for example, to symmetrical distributions of the reliability measures and a single free parameter (the offset). Generally, however, module 60 may correct the reliability measures such that their mean reaches some target mean (that is not necessarily zero). The target mean can be determined, for example, from a model that could depend on the width of the distribution but not on the offset.

When using the above technique in an MLC device having more than two programming levels, each pair of adjacent programming levels is typically distinguished by a different read threshold. Typically, processor 48 performs the above operation (computing of the mean LLR, multiplication by a factor and subtraction from the LLRs) independently for each such read threshold.

When using the above technique in conjunction with an interference cancellation process, processor 48 performs the above operation (computing of the mean LLR, multiplication by a factor and subtraction from the LLRs) independently for each group of memory cells having a common interference level.

In another embodiment, processor 48 may estimate the offset by storing a predefined bank of readout result distributions, for different respective offsets 80. When reading a particular group of memory cells, module 60 calculates the actual distribution of the readout results, and finds the distribution in the bank that is most similar to the actual distribution. The offset associated with the most similar distribution in the bank is regarded as the estimated offset. Module 60 may find the most similar distribution in any suitable way, such as using the Kullback-Leibler divergence.

Further alternatively, LLR correction module 60 may estimate offset 80, and correct the LLRs based on the estimated offset, using any other suitable technique.

Figure 3:
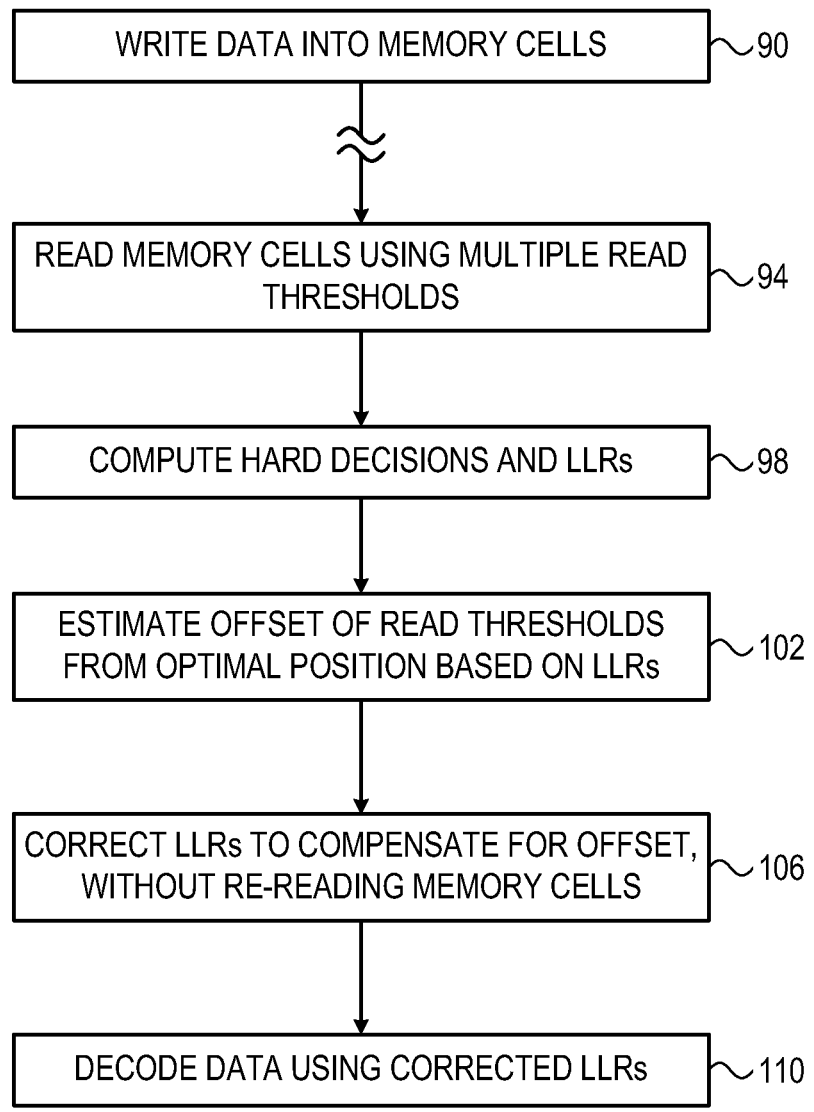
FIG. 3 is a flow chart that schematically illustrates a method for reading a group of analog memory cells, in accordance with an embodiment.

FIG. 3 is a flow chart that schematically illustrates a method for reading a group of analog memory cells, in accordance with an embodiment. The method begins with the storage circuitry (memory controller 40 and R/W unit 36) writing data into a group of memory cells 32, at a programming step 90.

At a later time, the storage circuitry reads the group of memory cells using multiple read thresholds, at a readout step 94. Soft demodulator 56 computes hard decisions and respective LLRs for the stored data bits based on the readout results, at a demodulation step 98.

LLR correction module 60 uses the LLRs to estimate the offset of the multiple read thresholds from the optimal threshold position, at an offset estimation step 102. Module 60 then corrects the LLRs as a function of the estimated offset, at an LLR correction step 106. Soft decoder 64 decodes the stored data using the corrected LLRs, at a decoding step 110. The decoded data is provided as output.

As explained above, the LLR correction at step 106 is calculated and applied so as to compensate for the offset. In other words, the corrected LLRs are similar to the LLRs that would be obtained if the read thresholds were positioned at the optimal position. Note that the LLR correction of step 106 is performed purely by computation, without having to actually move the read thresholds to the optimal position and re-read the memory cells. Therefore, latency and power consumption are reduced.

In some embodiments, however, processor 48 does move the read thresholds to the estimated optimal position (as defined above, based on the estimated offset) in preparation for the next readout operation. The next readout may be from the same group of memory cells or from a different group.

ALTERNATIVE VARIATIONS AND EMBODIMENTS

In some embodiments, soft demodulator 56 estimates the Signal to Noise Ratio (SNR) of the readout results, and calculates the LLRs as a function of the estimated SNR. Demodulator 56 may estimate the SNR or other measure of the noise level in the readout results, in various ways. In the present context, the terms "noise level" and "SNR" are used interchangeably.

For example, in a typical NAND Flash device, the cell threshold voltages drift downwards (to lower threshold voltages) over time and use. Because of threshold voltage drift, the programming level distributions gradually drift downwards to lower threshold voltages, and also become wider and closer to one another. When the programming levels become wider and closer to one another, the overlap between them increases and the probability of read errors increases accordingly. Additionally or alternatively, programming levels become wider and closer to one another due to other reasons, such as cross-coupling interference from other memory cells.

Under these conditions, the optimal positions of the read thresholds also drift downwards over time and use. Thus, the drift in the optimal read threshold position can be used as an indication of SNR (small drift means high SNR and vice versa).

When the memory cells use more than two programming levels, the optimal threshold positions between different pairs of programming levels become closer to one another over time and use or due to interference. Consider, for example, a group of 2 bits/cell memory cells that use four programming levels denoted {P0,P1,P2,P3} for storing two data pages denoted Least Significant Bit (LSB) and Most Significant Bit (MSB) pages.

When performing soft readout, the LSB page is read using a set of read thresholds denoted RV11, which is positioned between P1 and P2. The MSB page is read using two sets of read thresholds: One set denoted RV21 is positioned between P0 and P1, and the other set denoted RV22 is positioned between P2 and P3. Over time and use, as the SNR deteriorates, the optimal positions of RV21, RV11 and RV22 drift downwards and become closer to one another. Thus, the distance between the optimal threshold positions for different pairs of programming levels can be used as an indication of SNR (small distance means poor SNR and vice versa).

In some embodiments, demodulator 56 uses this characteristic behavior for estimating the SNR. In an example embodiment, demodulator 56 assesses the distance between the optimal threshold positions of two different pairs of programming levels, and uses this distance as a measure of SNR. A large distance is typically indicative of high SNR, and vice versa. The demodulator may assess, for example, the distance between the optimal positions of RV21 and RV22, the read thresholds of the MSB page.

In another embodiment, demodulator 56 assesses the deviation of the optimal threshold position (for a certain pair of programming levels) from its nominal position, and uses the deviation as a measure of SNR. A large deviation is typically indicative of poor SNR, and vice versa. This technique can be used with any of the read thresholds, e.g., RV11, RV21 or RV22. Processor 48 may use an SNR estimation performed for one threshold for readout using a different threshold. For example, processor 48 may use SNR estimates, which were obtained from the distance between RV21 and RV22, for computing LLRs for decoding the LSB page (read using RV11).

In summary, processor 48 may estimate the SNR by assessing a change in the optimal positions of read thresholds (e.g., change from nominal position or change in distance between read thresholds of different programming level pairs). This SNR estimate can be used for computing the LLRs as part of the disclosed techniques, or for any other purpose.

In alternative embodiments, processor 48 may estimate the SNR using the decoded data at the output of soft decoder 64. For example, processor 48 may estimate the SNR based on the mutual information (MI) that is computed using the decoded data, or other measure of information entropy of the readout results.

In alternative examples of assessing the information entropy, processor 48 may estimate the SNR using various measures defined over the empirical (measured) statistical distribution of the readout results. This technique can be used regardless of the decoded data, i.e., regardless of whether decoding succeeded or failed. For example, processor 48 may calculate the empirical entropy function ($\Sigma p_i \log p_i$) over multiple bins of the readout result distribution. In an example embodiment, processor 48 calculates the empirical entropy over seven bins (readout result values) around the optimal read threshold position. As another example, the processor may hold a Look-Up Table (LUT) that is indexed by a set of readout result values (e.g., seven values) and outputs the estimated SNR.

All of the SNR estimation techniques described above can be used by processor 48 for calculating the LLRs as part of the soft readout processes described herein. Alternatively, the SNR estimation techniques described above can be used for any other suitable purpose.

In alternative embodiments, processor 48 may calculate the LLRs in other ways, not necessarily involving SNR estimation. For example, the processor may calculate the LLRs based on the empirical distribution of readout results, i.e., based on the number of memory cells in each bin of a readout results (and thus the threshold voltage) histogram. This technique can be used either with or without the decoded data.

More generally, processor 48 may calculate a property of the Cumulative Distribution Function (CDF) of the readout results, and estimate the SNR based on this property. Typically, any property that is indicative of the width or shift of the programming level distributions can be used for this purpose. As explained above, a narrow distribution is typically indicative of high SNR, and vice versa.

Certain aspects of CDF-based threshold calculations are addressed in U.S. Patent Application Publication 2010/0091535, cited above. Any of the techniques described therein can be used for computing the LLRs. For example, the processor may estimate the LLRs by comparing the empirical CDF to a known (and possibly shifted) reference CDF. This technique can be performed in real-time or off-line, any may be used adaptively.

It will be appreciated that the embodiments described above are cited by way of example that is not limited to what has been particularly shown and described hereinabove. Rather, the scope includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An apparatus, comprising:
an interface configured to communicate with a memory that includes a plurality of memory cells; and
storage circuitry configured to:
store data into a subset of the plurality of memory cells;
read stored data from memory cells of the subset using a set of read voltage thresholds to generate a respective set of readout results of a plurality of readout results;
assess an information entropy of the plurality of readout results; and
estimate a noise level in the plurality of readout results dependent upon the assessed information entropy.

2. The apparatus of claim 1, wherein the storage circuitry is further configured to decode the stored data dependent upon the plurality of readout results to generate decoded data.

3. The apparatus of claim 2, wherein to assess the information entropy, the storage circuitry is further configured to calculate mutual information dependent upon the plurality of readout results and the decoded data.

4. The apparatus of claim 1, wherein the storage circuitry is further configured to assign each readout result of the plurality of readout results into a corresponding one of a plurality of bins.

5. The apparatus of claim 4, wherein to assess the information entropy, the storage circuitry is further configured to evaluate an empirical entropy function dependent upon a value indicative of a number of readout results assigned to each bin of the plurality of bins.

6. The apparatus of claim 4, wherein the storage circuitry includes a look-up table, wherein the look-up table includes a plurality of entries, and wherein to assess the information entropy, the storage circuitry is further configured to retrieve at least one entry from the plurality of entries included in the look-up table.

7. The apparatus of claim 6, wherein to retrieve the at least one entry, the storage circuitry is further configured to determine an index to access the look-up table, wherein the index is dependent upon a value indicative of a number of readout results assigned to each bin of the plurality of bins, and wherein the at least one entry corresponds to an estimate of the noise level.

8. A method, comprising:
 storing data into a subset of a plurality of memory cells;
 reading stored data from memory cells of the subset using a set of read voltage thresholds to generate a respective set of readout results of a plurality of readout results;
 assessing an information entropy of the plurality of readout results; and
 estimating a noise level in the plurality of readout results dependent upon the assessed information entropy.

9. The method of claim 8, further comprising decoding the stored data dependent upon the plurality of readout results to generate decoded data.

10. The method of claim 9, wherein assessing the information entropy comprises calculating mutual information dependent upon the plurality of readout results and the decoded data.

11. The method of claim 8, further comprising assigning each readout result of the plurality of readout results into a corresponding one of a plurality of bins.

12. The method of claim 11, wherein assessing the information entropy comprises evaluating an empirical entropy function dependent upon a value indicative of a number of readout results assigned to each bin of the plurality of bins.

13. The method of claim 11, wherein assessing the information entropy further comprises retrieving at least one entry from a plurality of entries included in a look-up table.

14. The method of claim 13, wherein retrieving the at least one entry comprises determining an index to access the look-up table, wherein the index is dependent upon a value indicative of a number of readout results assigned to each bin of the plurality of bins, and wherein the at least one entry corresponds to an estimate of the noise level.

15. An apparatus, comprising:
 a memory including a plurality of memory cells; and
 storage circuitry configured to:
  store data into a subset of the plurality of memory cells;
  read stored data from memory cells of the subset using a set of read voltage thresholds to generate a respective set of readout results of a plurality of readout results;
  assess an information entropy of the plurality of readout results; and
  estimate a noise level in the plurality of readout results dependent upon the assessed information entropy.

16. The apparatus of claim 15, wherein the storage circuitry is further configured to decode the stored data dependent upon the plurality of readout results to generate decoded data.

17. The apparatus of claim 16, wherein to assess the information entropy, the storage circuitry is further configured to calculate mutual information dependent upon the plurality of readout results and the decoded data.

18. The apparatus of claim 15, wherein the storage circuitry is further configured to assign each readout result of the plurality of readout results into a corresponding one of a plurality of bins.

19. The apparatus of claim 18, wherein to assess the information entropy, the storage circuitry is further configured to evaluate an empirical entropy function dependent upon a value indicative of a number of readout results assigned to each bin of the plurality of bins.

20. The apparatus of claim 18, wherein the storage circuitry includes a look-up table including a plurality of entries, and wherein to assess the information entropy, the storage circuitry is further configured to:
 determine an index to access the look-up table, wherein the index is dependent upon a value indicative of a number of readout results assigned to each bin of the plurality of bins; and
 retrieve, using the index, at least one entry from the plurality of entries included in the look-up table, wherein the at least one entry corresponds to an estimate of the noise level.

* * * * *